(12) United States Patent
Goto et al.

(10) Patent No.: US 11,804,450 B2
(45) Date of Patent: Oct. 31, 2023

(54) SEMICONDUCTOR DEVICE AND SEMICONDUCTOR MODULE

(71) Applicant: Murata Manufacturing Co., Ltd., Kyoto-fu (JP)

(72) Inventors: Satoshi Goto, Nagaokakyo (JP); Masayuki Aoike, Nagaokakyo (JP); Mikiko Fukasawa, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 32 days.

(21) Appl. No.: 17/644,043

(22) Filed: Dec. 13, 2021

(65) Prior Publication Data

US 2022/0199548 A1   Jun. 23, 2022

(30) Foreign Application Priority Data

Dec. 18, 2020   (JP) ................................. 2020-210053

(51) Int. Cl.
*H01L 23/552* (2006.01)
*H01L 23/49* (2006.01)
(Continued)

(52) U.S. Cl.
CPC ...... *H01L 23/552* (2013.01); *H01L 23/49822* (2013.01); *H01L 24/24* (2013.01);
(Continued)

(58) Field of Classification Search
CPC ............. H01L 23/552; H01L 23/49822; H01L 2224/13082; H01L 24/16; H01L 24/48; H01L 2224/16227; H01L 2224/24146; H01L 2224/4813; H01L 24/05; H01L 24/13; H01L 24/24; H01L 24/94; H01L 24/97; H01L 23/66; H01L 2223/6677; H01L 2224/16235; H01L 25/0652; H01L 21/82; H05K 9/0007
(Continued)

(56) References Cited

U.S. PATENT DOCUMENTS

| 2010/0027225 A1* | 2/2010 | Yuda ................... H05K 3/4697 156/247 |
| 2014/0252568 A1* | 9/2014 | Hwang ............... H05K 9/0007 257/659 |
| 2018/0033738 A1* | 2/2018 | Kawabata ......... H01L 23/49838 |

FOREIGN PATENT DOCUMENTS

JP   2002-151644 A   5/2002

* cited by examiner

*Primary Examiner* — Didarul A Mazumder
(74) *Attorney, Agent, or Firm* — Studebaker & Brackett PC

(57) ABSTRACT

A semiconductor device includes first and second members. In the first member, a first electronic circuit including a semiconductor element is formed. The second member is joined to an area of part of a first surface of the first member, and includes a second electronic circuit including a semiconductor element formed of a semiconductor material different from that of the semiconductor element of the first electronic circuit. An interlayer insulating film covers the second member and an area of the first surface of the first member to which the second member is not joined. An inter-member connection wire on the interlayer insulating film couples the first and second electronic circuits through an opening in the interlayer insulating film. A shield structure including a first metal pattern disposed on the interlayer insulating film shields a shielded circuit, which is part of the first electronic circuit, in terms of radio frequencies.

20 Claims, 18 Drawing Sheets

(51) Int. Cl.
*H01L 23/00* (2006.01)
*H01L 23/498* (2006.01)

(52) U.S. Cl.
CPC .............. *H01L 24/94* (2013.01); *H01L 24/97* (2013.01); *H01L 24/05* (2013.01); *H01L 24/13* (2013.01); *H01L 24/16* (2013.01); *H01L 24/48* (2013.01); *H01L 2224/05569* (2013.01); *H01L 2224/1357* (2013.01); *H01L 2224/13147* (2013.01); *H01L 2224/16227* (2013.01); *H01L 2224/24146* (2013.01); *H01L 2224/4813* (2013.01); *H01L 2224/94* (2013.01); *H01L 2224/97* (2013.01); *H01L 2924/10253* (2013.01); *H01L 2924/10329* (2013.01)

(58) Field of Classification Search
USPC .......................... 257/347; 438/147, 479, 517
See application file for complete search history.

SEMICONDUCTOR DEVICE AND SEMICONDUCTOR MODULE

CROSS-REFERENCE TO RELATED APPLICATION

This application claims benefit of priority to Japanese Patent Application No. 2020-210053, filed Dec. 18, 2020, the entire content of which is incorporated herein by reference.

BACKGROUND

Technical Field

The present disclosure relates to semiconductor devices and semiconductor modules.

Background Art

Radio-frequency (RF) front-end modules capable of both transmitting and receiving radio-frequency signals are installed in electronic devices for communications such as mobile communications and satellite communications. An RF front-end module includes, for example, a monolithic microwave integrated circuit (MMIC) capable of amplifying radio-frequency signals, a control integrated circuit (IC) for controlling a radio-frequency amplifier circuit, a switch IC, and a duplexer.

A structure in which the control IC is stacked on the MMIC is known for the purpose of reducing the size of the RF front-end module. Japanese Unexamined Patent Application Publication No. 2002-151644 discloses a semiconductor device in which a redistribution layer is formed on a lower-side semiconductor chip and an upper-side semiconductor chip is mounted on this redistribution layer by flip chip bonding. By mounting the lower-side semiconductor chip on a module substrate, the redistribution layer and the module substrate are electrically coupled by bonding wires.

SUMMARY

With the structure in which the control IC is mounted on the MMIC, radio-frequency interference is likely to occur between a radio-frequency circuit formed in the MMIC and an electronic circuit on the module substrate or between the radio-frequency circuit formed in the MMIC and an electronic circuit formed in the control IC. Accordingly, the present disclosure provides a semiconductor device that employs a stacking structure and that is capable of suppressing radio-frequency interference.

According to an aspect of the present disclosure, there is provided a semiconductor device including a first member in which a first electronic circuit including a semiconductor element is formed; and a second member in which a second electronic circuit is formed, the second electronic circuit including a semiconductor element formed of a semiconductor material that is different from a semiconductor material of the semiconductor element of the first electronic circuit, the second electronic circuit being joined to an area of part of a first surface, and the first surface being one of surfaces of the first member. The semiconductor device further includes an interlayer insulating film that covers the second member and an area of the first surface to which the second member is not joined; an inter-member connection wire disposed on the interlayer insulating film, the inter-member connection wire coupling the first electronic circuit and the second electronic circuit through an opening formed in the interlayer insulating film; and a shield structure that includes a first metal pattern disposed on the interlayer insulating film and shields a shielded circuit in terms of radio frequencies, the shielded circuit being part of the first electronic circuit.

According to another aspect of the present disclosure, there is provided a semiconductor module including a module substrate and a semiconductor device mounted on a mount surface of the module substrate, in which the semiconductor device includes a first member in which a first electronic circuit including a semiconductor element is formed, a second member in which a second electronic circuit is formed, the second electronic circuit including a semiconductor element formed of a semiconductor material that is different from a semiconductor material of the semiconductor element of the first electronic circuit, the second electronic circuit being joined to an area of part of a first surface, the first surface being one of surfaces of the first member, an interlayer insulating film that covers the first surface and the second member, an inter-member connection wire disposed on the interlayer insulating film, the inter-member connection wire coupling the first electronic circuit and the second electronic circuit through an opening formed in the interlayer insulating film, a shield structure that includes a first metal pattern disposed on the interlayer insulating film and shields a shielded circuit in terms of radio frequencies, the shielded circuit being part of the first electronic circuit, a first conductive protrusion protruding from the first metal pattern, and a second conductive protrusion provided on a surface of the second member that faces the module substrate, the second conductive protrusion being coupled to ground of the second electronic circuit, the module substrate includes a ground conductor, and a first land and a second land coupled to the ground conductor, and the first land and the second land are coupled to the first conductive protrusion and the second conductive protrusion, respectively.

By shielding the shielded circuit in terms of radio frequencies using the shield structure, it is possible to suppress radio-frequency interference between the second electronic circuit of the second member and the shielded circuit.

DETAILED DESCRIPTION

First Embodiment

Figure 1:
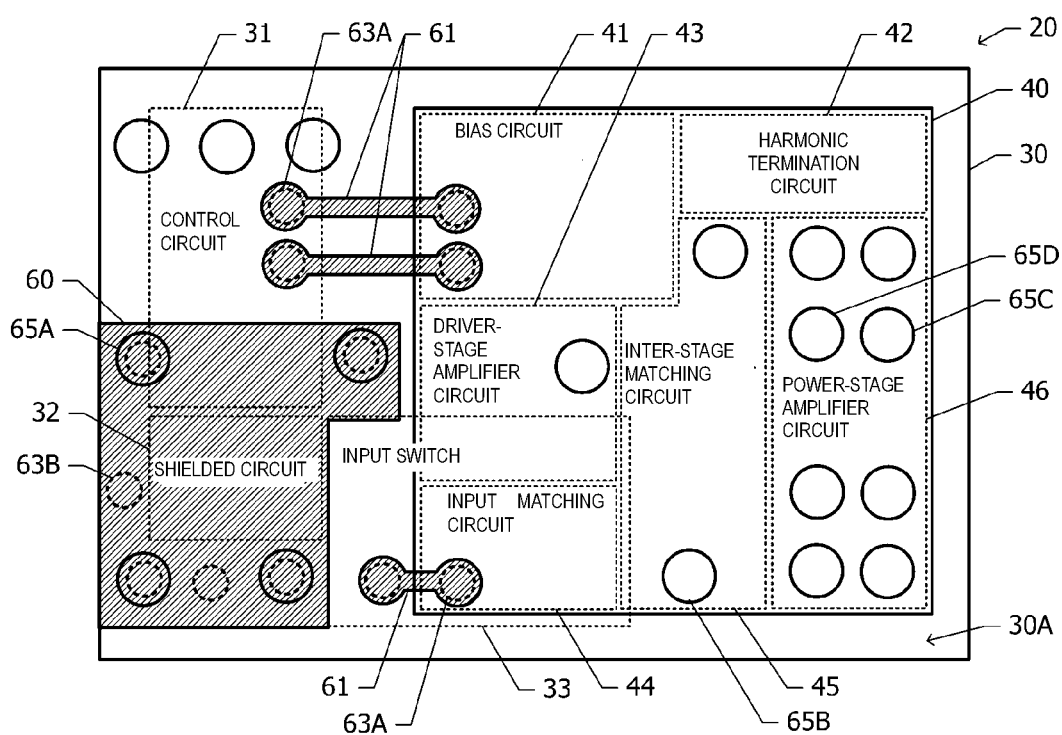
FIG. 1 is a diagram illustrating a planar spatial relationship among constituent elements of a semiconductor device according to a first embodiment.

Referring to FIG. 1 to FIG. 6D, a semiconductor device according to the first embodiment is described. FIG. 1 is a diagram illustrating a planar spatial relationship among constituent elements of a semiconductor device 20 according to the first embodiment. A second member 40 is joined to a surface of a first member 30 such that the second member 40 has surface contact therewith. Hereinafter, the surface of the first member 30 to which the second member 40 is joined is referred to as a first surface 30A. In plan view, the second member 40 is included in the first member 30. For example, the first member 30 is formed of an elemental semiconductor, and the second member 40 is formed of a compound semiconductor.

The first member 30 includes, for example, an elemental semiconductor-based semiconductor substrate and a first electronic circuit formed on the semiconductor substrate. As the semiconductor substrate, for example, a single crystal substrate formed of an elemental semiconductor such as silicon or a silicon-on-insulator (SOI) substrate is used. The first electronic circuit includes a semiconductor element such as an elemental semiconductor-based MOSFET or bipolar transistor. In the first electronic circuit, a control circuit 31, a shielded circuit 32, and an input switch 33 are included. Part of an area where the input switch 33 is formed overlaps the second member 40 in plan view.

The shielded circuit 32 is a circuit that may become a spurious generating source or a circuit susceptible to a disturbance noise. For example, as an example of the circuit that may become a spurious generating source, there is a charge pump. As an example of the circuit susceptible to a disturbance noise, there is a low-noise amplifier. In FIG. 1, the area where each circuit included in the first electronic circuit is formed is encircled by dashed line.

In the first surface 30A of the first member 30, the second member 40 is joined to the area that does not overlap the shielded circuit 32 in plan view. The second member 40 includes a semiconductor underlayer formed of a compound semiconductor layer and a second electronic circuit formed on the semiconductor underlayer. The second electronic circuit includes, for example, a heterojunction bipolar transistor (HBT) and a passive element. A semiconductor element included in the second electronic circuit is formed of a semiconductor material different from that of a semiconductor element included in the first electronic circuit.

In the second electronic circuit, a bias circuit 41, a harmonics termination circuit 42, a driver-stage amplifier circuit 43, an input matching circuit 44, an inter-stage matching circuit 45, and a power-stage amplifier circuit 46 are included. In FIG. 1, the area where each circuit included in the second electronic circuit is formed is encircled by dashed line.

A redistribution layer is disposed in an area where the first member 30 and the second member 40 overlap in plan view. The redistribution layer includes a first metal pattern 60 and a plurality of inter-member connection wires 61. In FIG. 1, the first metal pattern 60 and the plurality of inter-member connection wires 61 are shaded by hatching. The first metal pattern 60 is a metal film including the shielded circuit 32 in plan view. The plurality of inter-member connection wires 61 couple the first electronic circuit formed in the first member 30 and the second electronic circuit formed in the second member 40 through openings 63A formed in an interlayer insulating film below the redistribution layer. For example, two inter-member connection wires 61 couple the control circuit 31 formed in the first member 30 and the bias circuit 41 formed in the second member 40. Another inter-member connection wire 61 couples the input switch 33 formed in the first member 30 and the input matching circuit 44 formed in the second member 40.

In plan view, in the area included in the first metal pattern 60, a plurality of openings 63B are formed so as to penetrate through the interlayer insulating film below the redistribution layer in a thickness direction. The first metal pattern 60 reaches the first member 30 through these openings 63B.

A plurality of conductive protrusions such as, for example, a plurality of first conductive protrusions 65A, a plurality of second conductive protrusions 65B, a plurality of third conductive protrusions 65C, and a plurality of fourth conductive protrusions 65D are protruded from the redistribution layer. These conductive protrusions are electrically coupled to the first electronic circuit or the second electronic circuit. The first conductive protrusion 65A is coupled to the first metal pattern 60. The second conductive protrusion 65B and the fourth conductive protrusion 65D are coupled to ground of the second electronic circuit. The third conductive protrusion 65C is coupled to an output port of the power-stage amplifier circuit 46. Instead of the plurality of fourth conductive protrusions 65D, a stripe-like conductive protrusion extending in one direction in plan view may be disposed. Similarly, instead of the plurality of third conductive protrusions 65C, a stripe-like conductive protrusion may be disposed.

Next, functions of the first electronic circuit and the second electronic circuit are described. The input switch 33 selects one of a plurality of input ports. A radio-frequency signal input to the input port selected by the input switch 33 is input to the driver-stage amplifier circuit 43 via the input matching circuit 44. A radio-frequency signal amplified by the driver-stage amplifier circuit 43 is input to the power-stage amplifier circuit 46 via the inter-stage matching circuit 45. A radio-frequency signal amplified by the power-stage amplifier circuit 46 is output to the outside. Here, the outside means, for example, an electronic circuit provided on a module substrate on which the semiconductor device 20 is mounted.

The radio-frequency signal output to the outside is supplied to an antenna and is emitted from the antenna as a radio wave. The harmonics termination circuit 42 serves as an impedance matching circuit for a radio-frequency signal output from the power-stage amplifier circuit 46 and has a function of terminating unwanted harmonic waves included in the radio-frequency signal. The bias circuit 41 supplies bias currents to the driver-stage amplifier circuit 43 and the power-stage amplifier circuit 46.

The control circuit 31 controls the bias circuit 41. A charge pump included in the shielded circuit 32 steps up or steps down a power voltage supplied from the outside and supplies resultant voltages to the first electronic circuit and the second electronic circuit. A low-noise amplifier included in the shielded circuit 32 amplifies a received signal received by the antenna.

Figure 2:
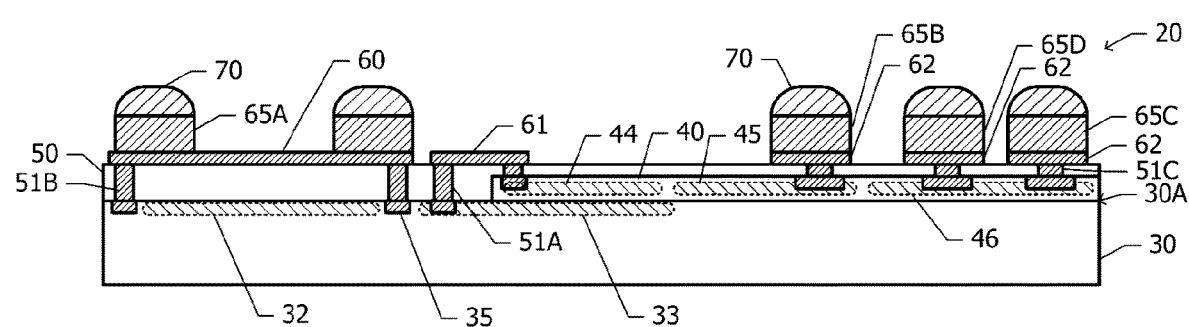
FIG. 2 is a diagram schematically illustrating a sectional structure of the semiconductor device according to the first embodiment.

FIG. 2 is a diagram schematically illustrating a sectional structure of the semiconductor device 20 according to the first embodiment. FIG. 2 does not illustrate a specific cross-section of the semiconductor device 20 according to the first embodiment and is a diagram illustrating respective constituent elements by focusing on electrical coupling therebetween.

The shielded circuit 32 and the input switch 33 are formed in a surface layer portion on the first surface 30A side of the first member 30. Moreover, a plurality of pads 35 are provided on the first surface 30A. The second member 40 is joined to the first surface 30A of the first member 30. The second member 40 is not disposed on the area where the shielded circuit 32 is disposed.

An interlayer insulating film 50 covers the second member 40 and the area to which the second member 40 is not joined in the first surface 30A of the first member 30. The interlayer insulating film 50 is formed of an organic insulating material such as, for example, polyimide. A plurality of vias 51A, 51B, and 51C penetrating through the interlayer insulating film 50 in the thickness direction are provided. The redistribution layer is disposed on the interlayer insulating film 50. The inter-member connection wire 61 included in the redistribution layer couples the input switch 33 and the input matching circuit 44 through the via 51A. The first metal pattern 60 included in the redistribution layer is coupled to the pad 35 of the first member 30 through the via 51B.

A plurality of pads 62 are further disposed on the interlayer insulating film 50. The plurality of pads 62 are each coupled to the second electronic circuit of the second member 40, for example, to the inter-stage matching circuit 45, or the power-stage amplifier circuit 46, through the corresponding vias 51C. Although not illustrated in FIG. 2, some of the pads 62 are also coupled to the first electronic circuit of the first member 30, for example, to the control circuit 31 (FIG. 1).

The plurality of first conductive protrusions 65A are disposed on the first metal pattern 60. The second conductive protrusion 65B, the third conductive protrusion 65C, and the fourth conductive protrusion 65D are respectively disposed on the plurality of pads 62. A solder 70 is laid on a top surface of each of the first conductive protrusion 65A, the second conductive protrusion 65B, the third conductive protrusion 65C, and the fourth conductive protrusion 65D. These conductive protrusions are, for example, formed of copper. A structure in which a solder layer is laid on the top surface of a conductive protrusion formed of copper is referred to as "Cu pillar bump". As the conductive protrusion, a structure in which no solder is laid thereon, such as an Au bump, may alternatively be employed. The protrusion having such structure is also referred to as "pillar". As the conductive protrusion, a structure in which a conductor pillar is set up on a pad may alternatively be employed. The conductive protrusion having such structure is also referred to as "post". As the conductive protrusion, a ball bump formed by reflowing solder to form a ball-like shape may alternatively be employed. As the conductive protrusion, in addition to the ones having these various structures described above, conductive protrusions that have various structures each including a conductor protruding from a substrate may also be used. In FIG. 2, the illustration of protection films that cover the first metal pattern 60 and the inter-member connection wires 61 is omitted.

Figure 3A:
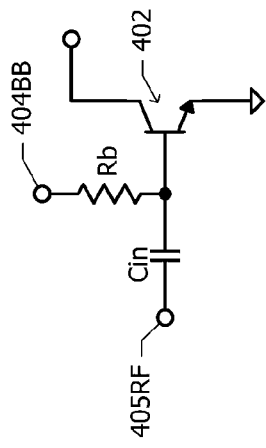
FIG. 3A is an equivalent circuit diagram of one cell that constitutes a power-stage amplifier circuit formed in a second member.

FIG. 3A is an equivalent circuit diagram of one cell that constitutes the power-stage amplifier circuit 46 (FIG. 1) formed in the second member 40. The power-stage amplifier circuit 46 includes a plurality of cells that are coupled in parallel to each other. Each cell includes a transistor 402, an input capacitor Cin, and a ballast resistive element Rb. The base of the transistor 402 is coupled to a radio-frequency signal input wire 405RF via the input capacitor Cin. Moreover, the base of the transistor 402 is coupled to a base bias wire 404BB via the ballast resistive element Rb. The emitter of the transistor 402 is grounded. A power voltage is applied to the collector of the transistor 402, and an amplified radio-frequency signal is output from the collector.

Figure 3B:
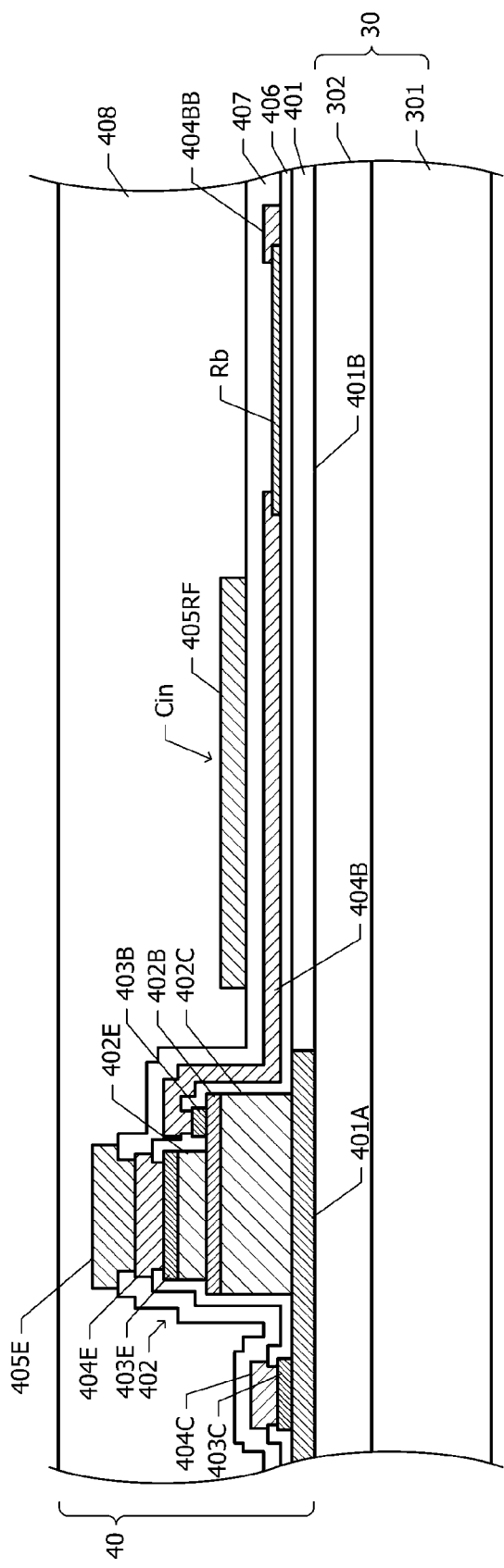
FIG. 3B is a sectional view of one cell that constitutes the power-stage amplifier circuit formed in the second member.

FIG. 3B is a sectional view of one cell that constitutes the power-stage amplifier circuit 46 formed in the second member 40. The first member 30 includes a substrate 301, such as a silicon substrate or a SOI substrate, having a semiconductor area, and a multilayer wiring structure 302 disposed on the substrate 301. Although not illustrated in FIG. 3B, on the other area of the substrate 301, the first electronic circuit, for example, the control circuit 31, the shielded circuit 32, or the input switch 33 (FIG. 1), is formed. A protection film that covers a surface of the multilayer wiring structure 302 may be disposed. In this case, the second member 40 is joined to the first member 30 so as to have surface contact with a surface of the protection film.

The second member 40 includes a semiconductor underlayer 401. The second member 40 is joined to the first member 30 by the semiconductor underlayer 401 being in surface contact with the first member 30. The semiconductor underlayer 401 is divided into a conductive area 401A and an element isolation area 401B. For the semiconductor underlayer 401, for example, GaAs is used. The conductive area 401A is formed of a N-type GaAs, and the element isolation area 401B is formed by implanting ions of an insulating impurity into a N-type GaAs layer.

The transistor 402 is disposed on the conductive area 401A. The transistor 402 includes a collector layer 402C, a base layer 402B, and an emitter layer 402E, which are stacked in this order from the conductive area 401A. The emitter layer 402E is disposed on part of the area of the base layer 402B. For example, the collector layer 402C is formed of a N-type GaAs, the base layer 402B is formed of a P-type GaAs, and the emitter layer 402E is formed of a N-type InGaP. That is to say, the transistor 402 is a heterojunction bipolar transistor.

A base electrode 403B is disposed on the base layer 402B, and the base electrode 403B is electrically coupled to the base layer 402B. An emitter electrode 403E is disposed on the emitter layer 402E, and the emitter electrode 403E is electrically coupled to the emitter layer 402E. A collector electrode 403C is disposed on the conductive area 401A. The collector electrode 403C is electrically coupled to the collector layer 402C via the conductive area 401A.

A first-layer interlayer insulating film 406 is disposed on the semiconductor underlayer 401 so as to cover the transistor 402, the base electrode 403B, the emitter electrode 403E, and the collector electrode 403C. The first-layer interlayer insulating film 406 is formed of an inorganic insulating material such as, for example, SiN. A plurality of openings are formed in the interlayer insulating film 406.

A first-layer emitter wire 404E, a collector wire 404C, a base wire 404B, the base bias wire 404BB, and the ballast resistive element Rb are disposed on the interlayer insulating film 406. The emitter wire 404E is coupled to the emitter electrode 403E through an opening formed in the interlayer insulating film 406. The collector wire 404C is coupled to the collector electrode 403C through another opening formed in the interlayer insulating film 406. The base wire 404B is coupled to the base electrode 403B through still another opening formed in the interlayer insulating film 406.

The base wire 404B extends to an area where the transistor 402 is not disposed, and a top portion of the base wire 404B overlaps one end portion of the ballast resistive element Rb. In this overlapping part, the base wire 404B and the ballast resistive element Rb are electrically coupled to each other. The other end portion of the ballast resistive element Rb overlaps the base bias wire 404BB. In this overlapping part, the ballast resistive element Rb and the base bias wire 404BB are electrically coupled to each other.

A second-layer interlayer insulating film 407 is disposed on the interlayer insulating film 406 so as to cover the first-layer emitter wire 404E, the collector wire 404C, the base wire 404B, the ballast resistive element Rb, and the base bias wire 404BB. The second-layer interlayer insulating film 407 is also formed of an inorganic insulating material such as SiN.

A second-layer emitter wire 405E and the radio-frequency signal input wire 405RF are disposed on the second-layer interlayer insulating film 407. The second-layer emitter wire 405E is coupled to the first-layer emitter wire 404E through an opening formed in the second-layer interlayer insulating film 407. Part of the radio-frequency signal input wire 405RF overlaps the first-layer base wire 404B in plan view. The input capacitor CM is formed in an area where the part of the radio-frequency signal input wire 405RF overlaps the base wire 404B.

A third-layer interlayer insulating film 408 is disposed so as to cover the second-layer emitter wire 405E and the radio-frequency signal input wire 405RF. The third-layer interlayer insulating film 408 is formed of an organic insulating material such as, for example, polyimide.

Figure 4:
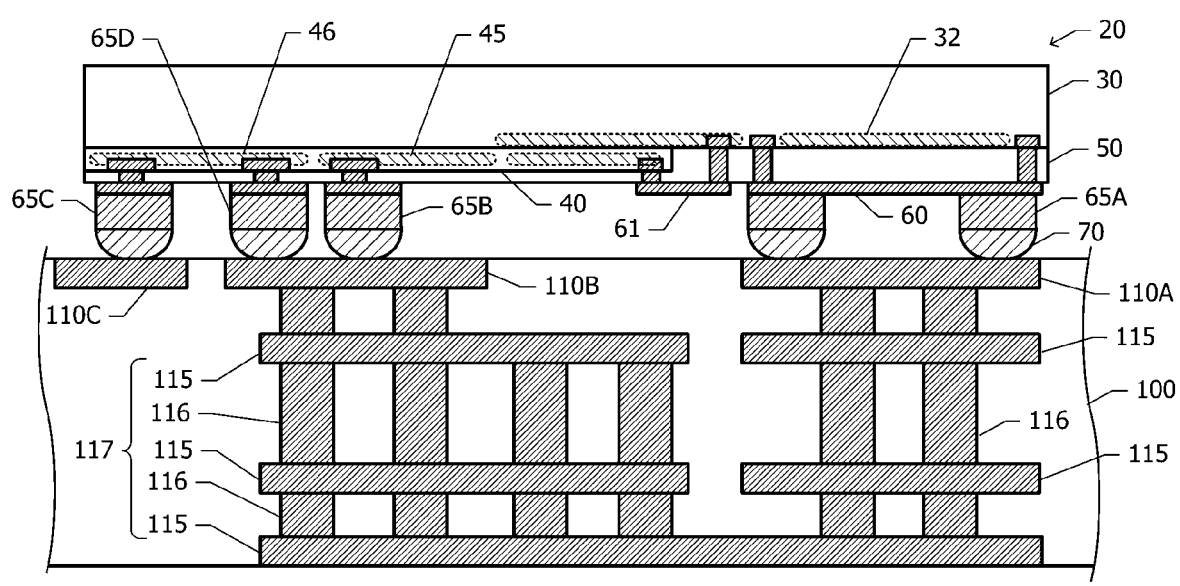
FIG. 4 is a schematic diagram illustrating a sectional structure of a semiconductor module including a module substrate and the semiconductor device according to the first embodiment.

FIG. 4 is a schematic diagram illustrating a sectional structure of a semiconductor module including the semiconductor device 20 according to the first embodiment and a module substrate 100. The semiconductor device 20 is mounted on a mount surface of the module substrate 100 in flip-chip (face-down) bonding. A plurality of lands such as a first land 110A, a second land 110B, and a third land 110C are disposed on the mount surface of the module substrate 100. A ground conductor 117 is provided in the module substrate 100. The ground conductor 117 includes a plurality of layers of ground planes 115 disposed on inner layers and a lower surface of the module substrate 100 opposite to the mount surface thereof and a plurality of ground vias 116 coupling the plurality of layers of ground planes 115 to each other. The ground conductor 117 is coupled to the first land 110A and the second land 110B.

In the inner layers of the module substrate 100, the ground plane 115 coupled to the first land 110A and the ground plane 115 coupled to the second land 110B are separated from each other. The ground plane 115 disposed on the lower surface of the module substrate 100 is continuous from the part coupled to the first land 110A to the part coupled to the second land 110B.

The first conductive protrusion 65A of the semiconductor device 20 is fixed and electrically coupled to the first land 110A with the solder 70 interposed therebetween. The second conductive protrusion 65B and the fourth conductive protrusion 65D are fixed and electrically coupled to the second land 110B with the solder 70 interposed therebetween. The third conductive protrusion 65C is fixed and electrically coupled to the third land 110C with the solder 70 interposed therebetween. A ground potential is provided to the second electronic circuit formed in the second member 40 via the second conductive protrusion 65B and the fourth conductive protrusion 65D. The first metal pattern 60 is coupled to the ground conductor 117 of the module substrate 100 via the first conductive protrusion 65A.

Figure 5A:
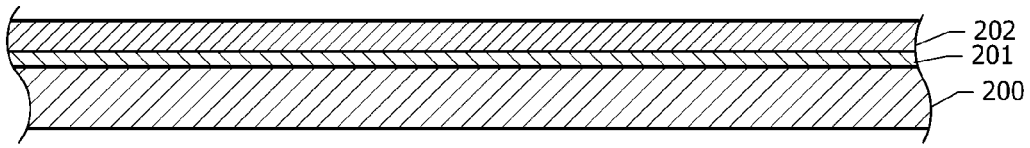
FIGS. 5A to 5F provide sectional views of a semiconductor device during a manufacturing process.
Figure 5B:
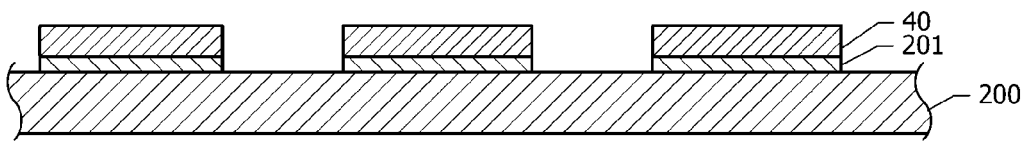
Figure 5C:
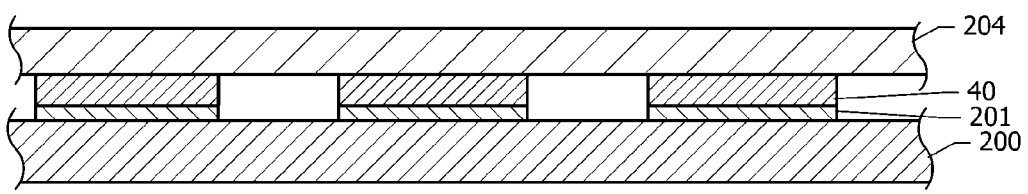
Figure 5D:
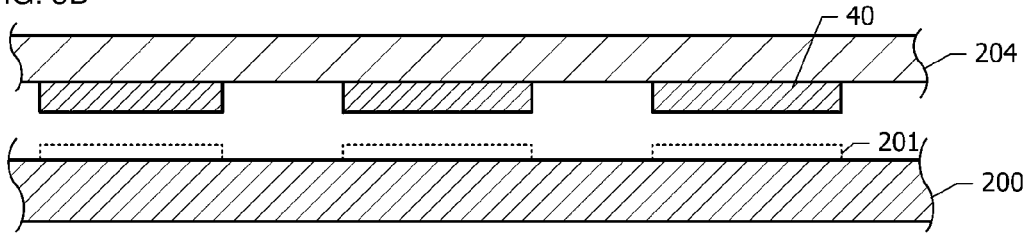
Figure 5E:
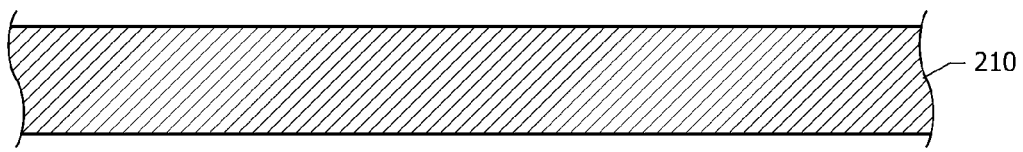
Figure 5F:
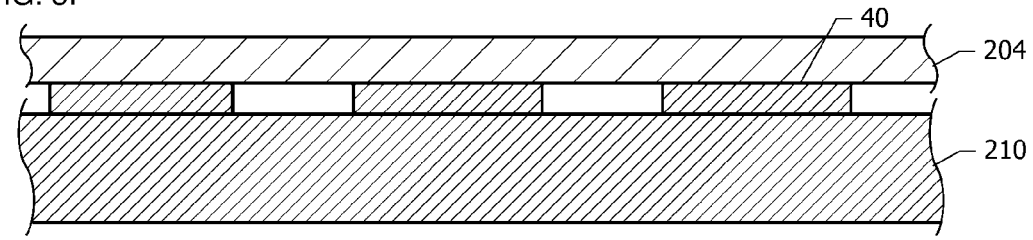
Figure 6A:
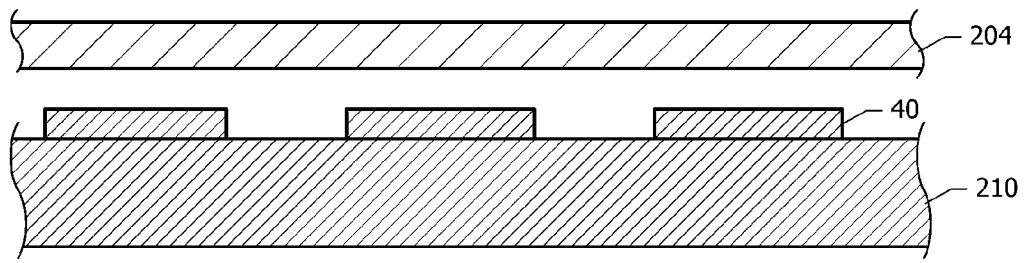
FIGS. 6A to 6C provide sectional views of the semiconductor device during the manufacturing process.
Figure 6B:
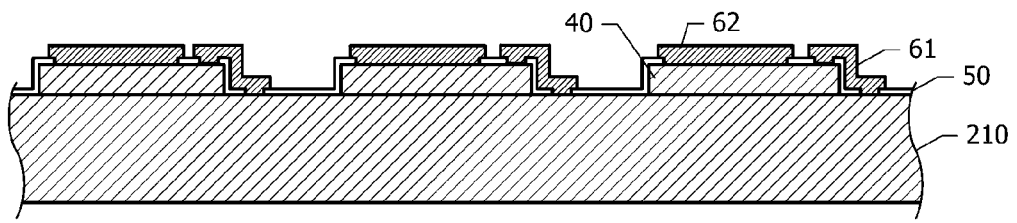
Figure 6C:
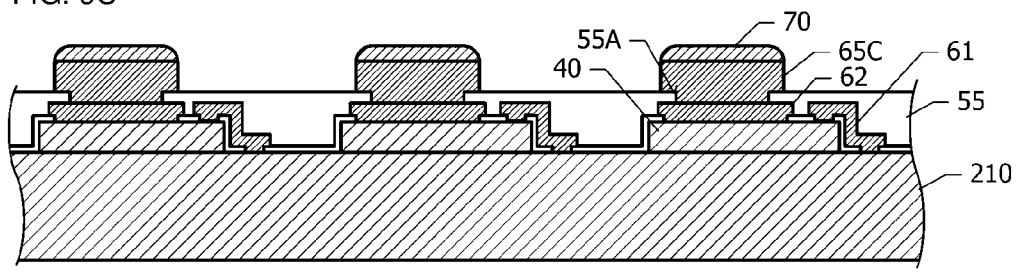
Figure 6D:
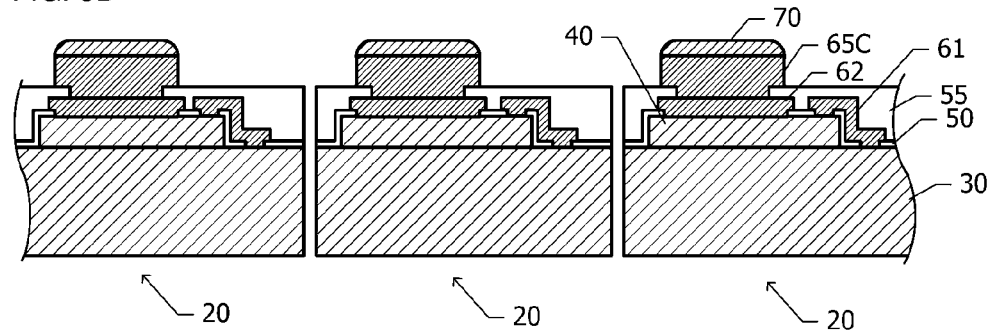
FIG. 6D is a sectional view of a finished semiconductor device.

Next, referring to FIG. 5A to FIG. 6D, a method of manufacturing the semiconductor device 20 according to the first embodiment is described. The drawings in FIG. 5A to FIG. 6C are sectional views of the semiconductor device 20 during a manufacturing process, and FIG. 6D is a sectional view of a finished semiconductor device 20.

As illustrated in FIG. 5A, a release layer 201 is epitaxially grown on a single-crystal base substrate 200 formed of a compound semiconductor such as GaAs, and an element formation layer 202 is formed on the release layer 201. In the element formation layer 202, element structures of the second member 40 illustrated in FIG. 2 and FIG. 3B are formed. These element structures are formed in accordance with a common semiconductor manufacturing process. In FIG. 5A, the illustration of the element structures formed in the element formation layer 202 is omitted. In this stage, an element structure corresponding to a plurality of semiconductor devices 20 is formed in the element formation layer 202, and the individual semiconductor devices 20 are not yet separated from each other.

Next, as illustrated in FIG. 5B, the element formation layer 202 (FIG. 5A) and the release layer 201 are subjected to patterning by using a resist pattern (not illustrated in the drawing) as an etch mask. In this stage, the element formation layer 202 is divided into the individual second members 40.

Next, as illustrated in FIG. 5C, a connecting support 204 is attached to the divided second members 40. As a result, a plurality of the second member 40 are connected to each other by the connecting support 204. The resist pattern used as an etch mask in the patterning step of FIG. 5B may be left so that the resist pattern exists between the second member 40 and the connecting support 204.

Next, as illustrated in FIG. 5D, the release layer 201 corresponding to the base substrate 200 and the second member 40 is selectively etched. As a result, the second member 40 and the connecting support 204 are released from the base substrate 200. To selectively etch the release layer 201, as the release layer 201, a compound semiconductor having an etch resistance different from both the etch resistance of the base substrate 200 and the etch resistance of the second member 40 is used.

As illustrated in FIG. 5E, a substrate 210, on which, for example, the first electronic circuit (FIG. 2) of the first member 30 and the multilayer wiring structure 302 (FIG. 3) are formed, is prepared. In this stage, the substrate 210 is not yet separated into the individual semiconductor devices 20.

As illustrated in FIG. 5F, the second member 40 is joined to the substrate 210. The second member 40 and the substrate 210 are joined by the Van der Waals force or hydrogen bonding. Alternatively, the second member 40 may be joined to the substrate 210 by, for example, static electricity, covalent bonding, or eutectic alloy bonding. For example, in the case where part of a surface of the substrate 210 is formed of Au, the second member 40 may be joined to the substrate 210 by the second member 40 being in close contact with an Au area and applying pressure thereto.

Next, as illustrated in FIG. 6A, the connecting support 204 is released from the second member 40. After releasing the connecting support 204, as illustrated in FIG. 6B, the interlayer insulating film 50 and the redistribution layer are formed on the substrate 210 and the second member 40. The redistribution layer includes the inter-member connection wires 61 and the pads 62. Although not illustrated in FIG. 6B, the redistribution layer also includes the first metal pattern 60 (FIG. 2). FIG. 2 illustrates the configuration in which an upper surface of the interlayer insulating film 50 is planarized, while FIG. 6B illustrates the example in which the upper surface of the interlayer insulating film 50 is not planarized.

Next, as illustrated in FIG. 6C, a protection film 55 is formed on the redistribution layer, and a plurality of openings are formed in the protection film 55. The plurality of openings are respectively formed in areas where the first conductive protrusion 65A, the second conductive protrusion 65B, and the third conductive protrusion 65C, which are illustrated in FIG. 2, are to be disposed. Subsequently, the first conductive protrusion 65A, the second conductive protrusion 65B, and the third conductive protrusion 65C are formed in these openings and on the protection film 55. In FIG. 6C, only the third conductive protrusion 65C appears. Moreover, a reflow process is performed in the state in which the solders 70 are laid on top surfaces of these conductive protrusions.

Finally, as illustrated in FIG. 6D, the substrate 210 is cut with a dicing machine. This yields the semiconductor devices 20 cut into individual pieces. Each of the first members 30 of the individual semiconductor devices 20 is larger than the second member 40 in plan view. The individual semiconductor device 20 is mounted on the module substrate 100 (FIG. 4) in flip-chip bonding.

Next, advantageous effects of the first embodiment is described. In the first embodiment, as illustrated in FIG. 4, the first metal pattern 60 is coupled to the ground conductor 117 of the module substrate 100 via the first conductive protrusion 65A. Because of this, the first metal pattern 60 serves as a shield structure that shields the shielded circuit 32 in terms of radio frequencies. Here, the shielding in terms of radio frequencies means an electromagnetic shielding in radio-frequency band. This enables radio-frequency interference to be suppressed, for example, between the shielded circuit 32 and the second electronic circuit formed in the second member 40, or between the shielded circuit 32 and another electronic circuit provided on the module substrate 100.

In the first embodiment, the ground plane 115 coupled to the first land 110A and the ground plane 115 coupled to the second land 110B are separated from each other in the inner layers of the module substrate 100. The ground planes 115 that are separated from each other in the inner layers are coupled to each other via the ground plane 115 disposed on the lower surface of the module substrate 100. Because of this, a current path from the first land 110A to the second land 110B via the ground conductor 117 becomes longer. Because of this, transmission of radio-frequency noise is suppressed between the ground of the second electronic circuit of the second member 40 and the first metal pattern 60. This enables an effect of shielding the shielded circuit 32 to be improved in terms of radio frequencies. Because the first land 110A and the second land 110B are coupled to each other by the ground plane 115 on the lower surface of the module substrate 100, the first land 110A and the second land 110B are kept at the same potential in terms of direct current.

Moreover, in the first embodiment, the first metal pattern 60 (FIG. 1, FIG. 2) that serves as the shield structure is included in the redistribution layer in which the inter-member connection wires 61 are disposed. Therefore, it becomes possible to form the shield structure without adding any new process.

Next, a modification of the first embodiment is described. In the first embodiment, the metal film that includes the shielded circuit 32 in plan view is used as the first metal pattern 60. Alternatively, for the first metal pattern 60, for example, a grid pattern or a stripe-like pattern may be used. In the first embodiment, a single layer of redistribution layer is disposed on the interlayer insulating film 50. However, two or more layers of redistribution layers may be disposed. In such case, the first metal pattern 60 may be disposed on a plurality of redistribution layers.

In the first embodiment, as illustrated in FIG. 4, the ground plane 115 coupled to the first land 110A and the ground plane 115 coupled to the second land 110B are separated from each other in the inner layers of the module substrate 100. As an alternative configuration, at a location shallower than a first location from the mount surface in the thickness direction of the module substrate 100, the ground plane 115 coupled to the first land 110A and the ground plane 115 coupled to the second land 110B may be separated from each other, and at a location deeper than the first location, the ground plane 115 coupled to the first land 110A may be continuous to the ground plane 115 coupled to the second land 110B.

Second Embodiment

Figure 7:
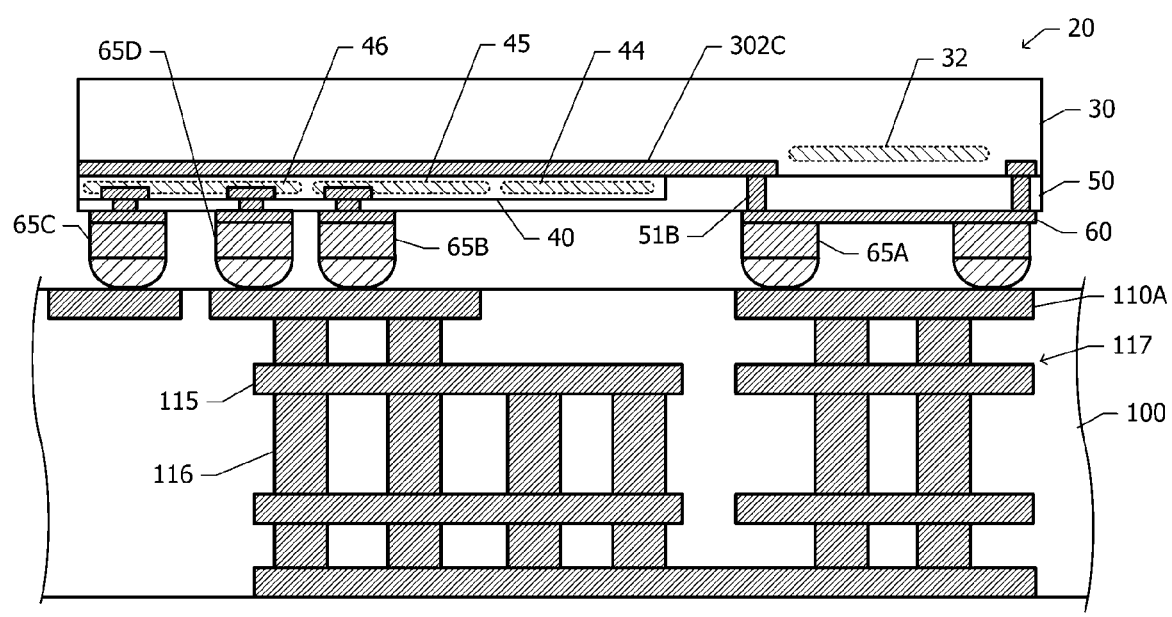
FIG. 7 is a schematic diagram illustrating a sectional structure of a semiconductor module according to a second embodiment.

Next, referring to FIG. 7, a semiconductor module according to the second embodiment is described. In the following description, the descriptions regarding configurations common to the semiconductor device and the semiconductor module according to the first embodiment described with reference to FIG. 1 to FIG. 6D are omitted.

FIG. 7 is a schematic diagram illustrating a sectional structure of a semiconductor module according to the second embodiment. In the second embodiment, the first member 30 includes a metal area 302C at the interface with the second member 40. The metal area 302C is included in the multilayer wiring structure 302 (FIG. 3B). The metal area 302C is electrically coupled to the first metal pattern 60 through a via MB that penetrates through the interlayer insulating film 50 in the thickness direction. The first metal pattern 60 is electrically coupled to the ground conductor 117 of the module substrate 100 via the first conductive protrusion 65A, and thus the metal area 302C is also electrically coupled to the ground conductor 117.

Next, advantageous effects of the second embodiment are described. In the second embodiment, the metal area 302C serves as the shield structure, and thus transmission of radio-frequency noise from the second electronic circuit or to the second electronic circuit formed in the second member 40 via the substrate 301 is suppressed. This enables an effect of suppressing radio-frequency interference to be improved.

Third Embodiment

Figure 8:
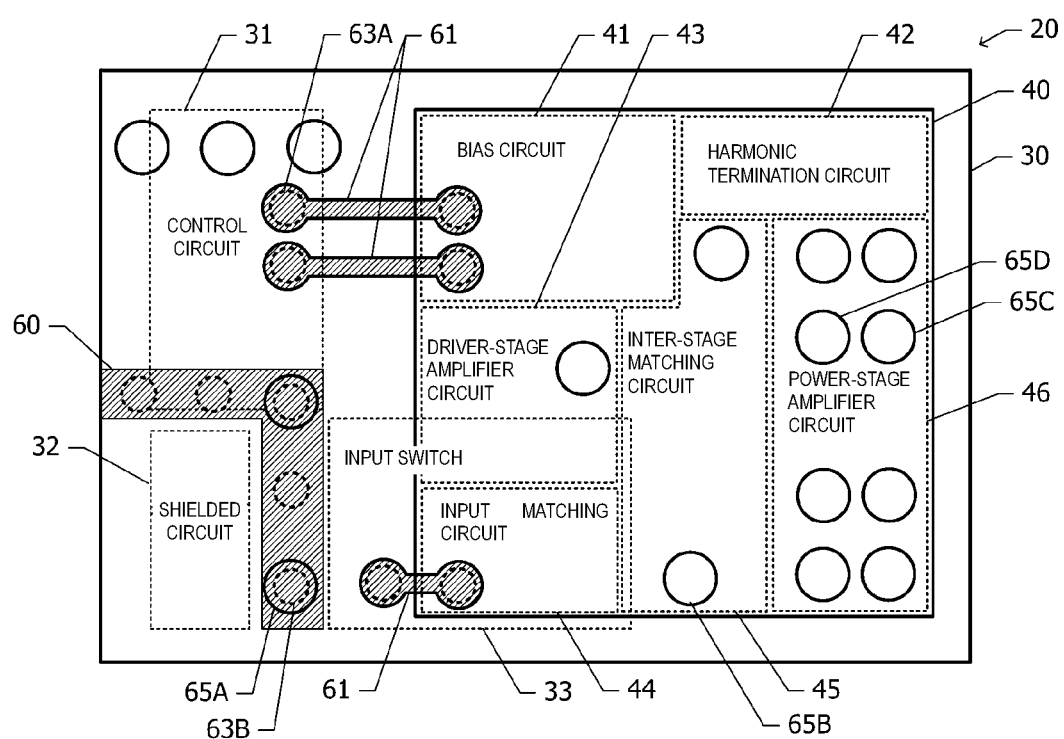
FIG. 8 is a diagram illustrating a planar spatial relationship among constituent elements of a semiconductor device according to a third embodiment.
Figure 9:
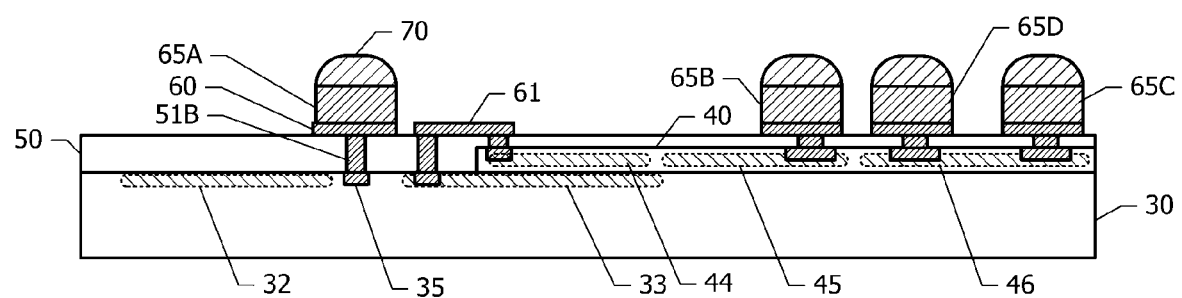
FIG. 9 is a diagram schematically illustrating a sectional structure of the semiconductor device according to the third embodiment.

Next, referring to FIG. 8 and FIG. 9, a semiconductor device according to the third embodiment is described. In the following description, the descriptions regarding configurations common to the semiconductor device and the semiconductor module according to the first embodiment described with reference to FIG. 1 to FIG. 6D are omitted.

FIG. 8 is a diagram illustrating a planar spatial relationship among constituent elements of a semiconductor device 20 according to the third embodiment. In the first embodiment (FIG. 1), the first metal pattern 60 includes the shielded circuit 32 in plan view. Whereas, in the third embodiment, the first metal pattern 60 is disposed between an area where the shielded circuit 32 is disposed and an area where the second electronic circuit formed in the second member 40 is disposed and between the area where the shielded circuit 32 is disposed and an area where another first electronic circuit formed in the first member 30 is disposed. Moreover, a plurality of openings 63B and a plurality of vias 51B (FIG. 9) formed by filling the respective openings 63B are disposed between the area where the shielded circuit 32 is disposed and the area where the second electronic circuit of the second member 40 is disposed and between the area where the shielded circuit 32 is disposed and the area where another first electronic circuit of the first member 30 is disposed.

FIG. 9 is a diagram schematically illustrating a sectional structure of the semiconductor device 20 according to the third embodiment. The first metal pattern 60 and a plurality of vias 51B are disposed between the shielded circuit 32 and the second electronic circuit that includes, for example, the input matching circuit 44, the inter-stage matching circuit 45, and the power-stage amplifier circuit 46, formed in the second member 40. Each of the plurality of vias 51B penetrates through the interlayer insulating film 50 in the thickness direction and couples the pad 35 provided on the first surface of the first member 30 and the first metal pattern 60. The first conductive protrusions 65A protrudes from the first metal pattern 60. The first conductive protrusion 65A is electrically coupled to the ground conductor 117 (FIG. 4) of the module substrate 100.

Next, advantageous effects of the third embodiment are described. In the third embodiment, the plurality of vias 51B and the first metal pattern 60, which are disposed between the area where the shielded circuit 32 is disposed and the area where the second electronic circuit of the second member is disposed, serve as the shield structure (shield wall structure). This enables radio-frequency interference to be suppressed between the shielded circuit 32 and the second electronic circuit of the second member 40. For example, it becomes possible to alleviate an effect of spurious generated at the shielded circuit 32 onto the second electronic circuit. Conversely, it also becomes possible to alleviate an effect of electromagnetic noise generated at the power-stage amplifier circuit 46 onto the shielded circuit 32.

Similarly, this enables radio-frequency interference to be suppressed between the shielded circuit 32 and another first electronic circuit of the first member 30, for example, the control circuit 31 (FIG. 8) or the input switch 33 (FIG. 8).

Fourth Embodiment

Figure 10:
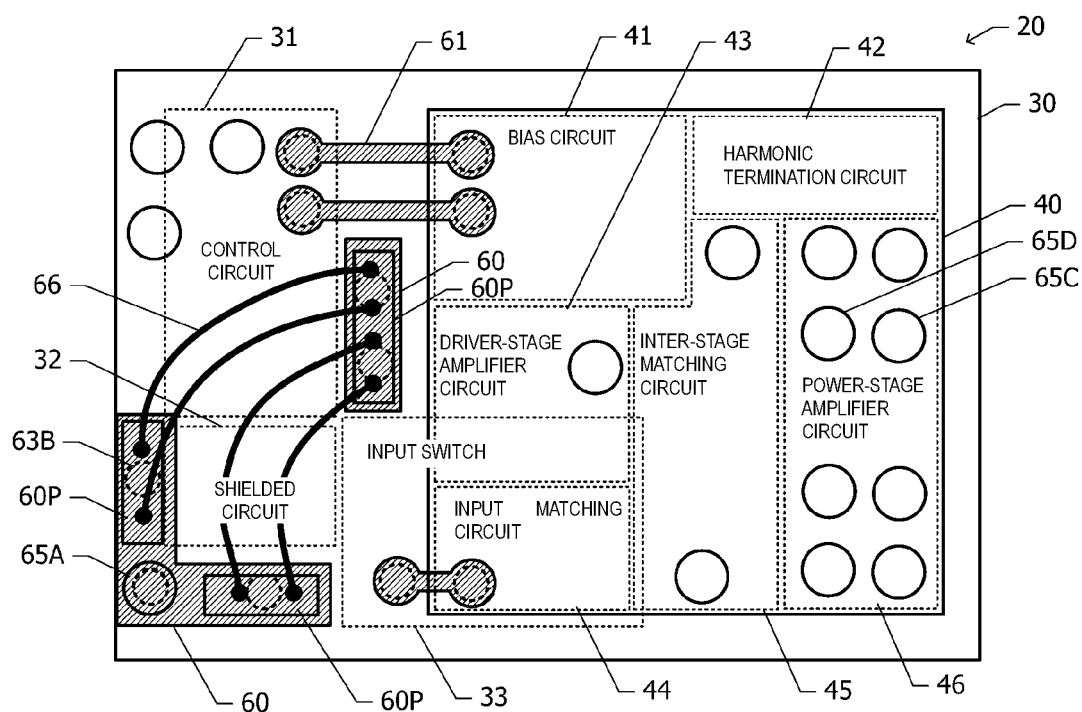
FIG. 10 is a diagram illustrating a planar spatial relationship among constituent elements of a semiconductor device according to a fourth embodiment.
Figure 11:
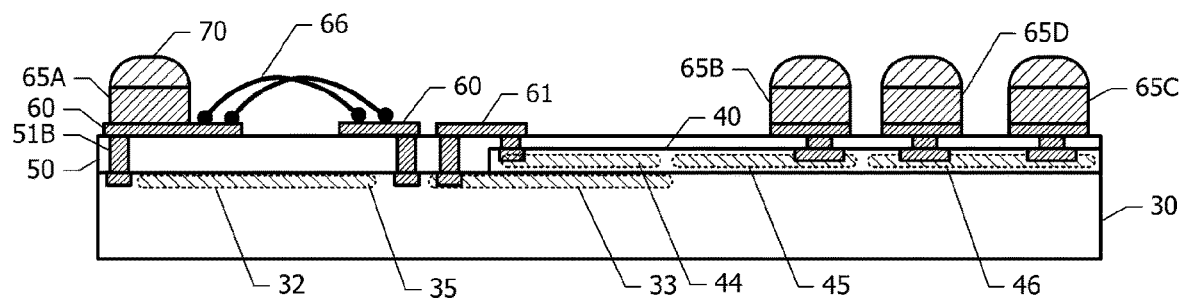
FIG. 11 is a diagram schematically illustrating a sectional structure of the semiconductor device according to the fourth embodiment.
Figure 12:
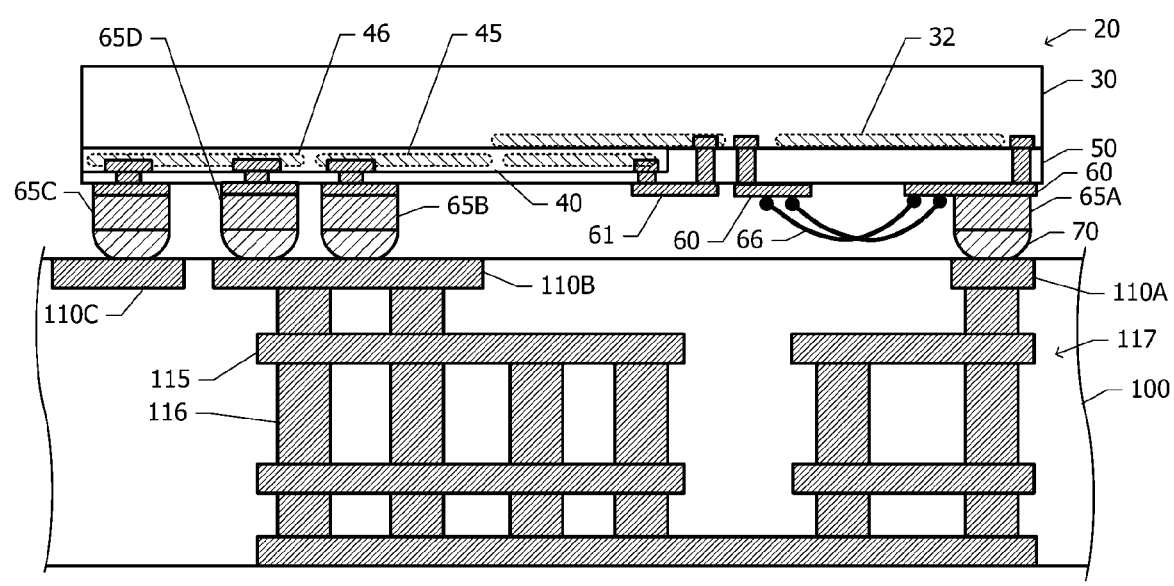
FIG. 12 is a diagram schematically illustrating a sectional structure of a semiconductor module including a module substrate and the semiconductor device according to the fourth embodiment.

Next, referring to FIG. 10, FIG. 11, and FIG. 12, a semiconductor device according to the fourth embodiment is described. In the following description, the descriptions regarding configurations common to the semiconductor device and the semiconductor module according to the first embodiment described with reference to FIG. 1 to FIG. 6D are omitted.

FIG. 10 is a diagram illustrating a planar spatial relationship among constituent elements of a semiconductor device 20 according to the fourth embodiment. In the first embodiment (FIG. 1), the first metal pattern 60 includes the shielded circuit 32 in plan view. Whereas, in the fourth embodiment, the first metal patterns 60 are disposed on an area that overlaps a periphery portion of the area where the shielded circuit 32 is disposed in plan view and on the outside of the area where the shielded circuit 32 is disposed.

Moreover, a plurality of metal wires 66 are disposed so as to pass through the area where the shielded circuit 32 is disposed in plan view. More specifically, the first metal pattern 60 is covered by a protection film, and openings are formed in this protection film so as to be included in the first metal pattern 60 in plan view. The first metal pattern 60 exposed inside the opening, which is formed in the protection film, is used as a pad 60P for wire bonding. Both end portions of each of the plurality of metal wires 66 are bonded to the pads 60P.

FIG. 11 is a diagram schematically illustrating a sectional structure of the semiconductor device 20 according to the fourth embodiment. A plurality of the metal wires 66 extend from one first metal pattern 60, pass over the interlayer insulating film 50, and reaches another first metal pattern 60. The first conductive protrusion 65A protrudes from at least one of the first metal patterns 60.

FIG. 12 is a diagram schematically illustrating a sectional structure of a semiconductor module including the module substrate 100 and the semiconductor device 20 according to the fourth embodiment. The first conductive protrusion 65A is electrically coupled to the ground conductor 117 of the module substrate 100. Because of this, the plurality of metal wires 66 are electrically coupled to the ground conductor 117 of the module substrate 100 via the first metal pattern 60 and the first conductive protrusion 65A.

Next, advantageous effects of the fourth embodiment are described. In the fourth embodiment, the plurality of metal wires 66 serve as the shield structure. Because of this, as is the case with the first embodiment, it becomes possible to suppress radio-frequency interference, for example, between the shielded circuit 32 and the second electronic circuit formed in the second member 40, or between the shielded circuit 32 and another electronic circuit provided on the module substrate 100.

Parts other than the end portions of the plurality of metal wires 66 are disposed so as to have distances from the surface of the interlayer insulating film 50. That is to say, the plurality of metal wires 66 are disposed at locations away from the shielded circuit 32 compared with the metal pattern provided on the surface of the interlayer insulating film 50. This enables an advantageous effect of reducing a parasitic capacitance between the shield structure including the plurality of metal wires 66 and the shielded circuit 32 to be obtained.

Fifth Embodiment

Figure 13:
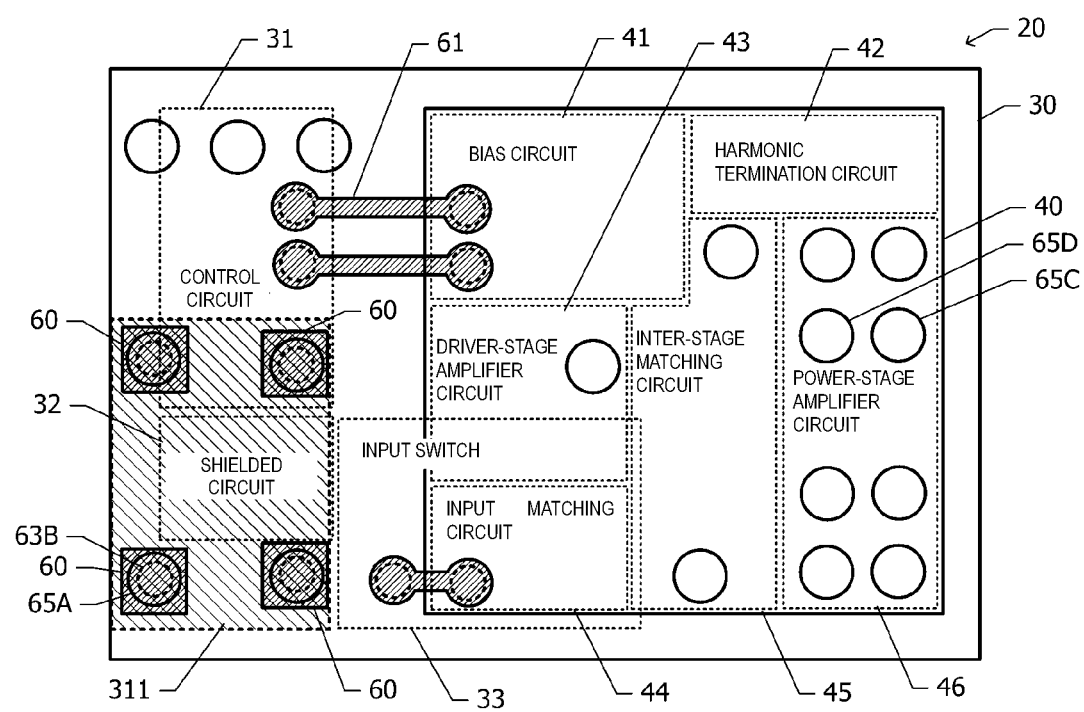
FIG. 13 is a diagram illustrating a planar spatial relationship among constituent elements of a semiconductor device according to a fifth embodiment.
Figure 14:
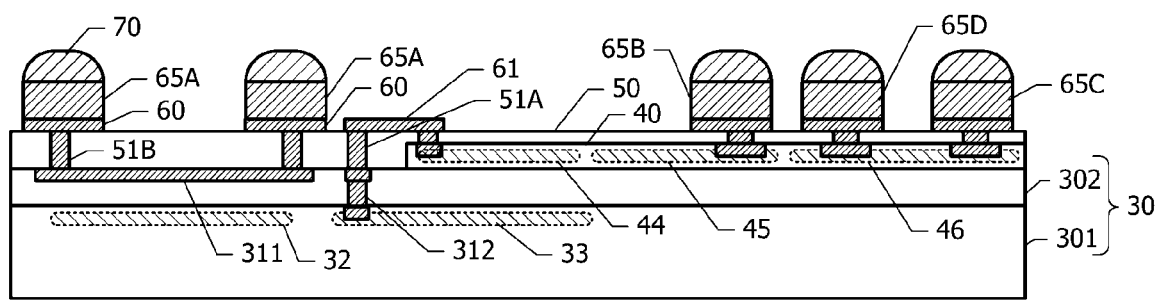
FIG. 14 is a diagram schematically illustrating a sectional structure of the semiconductor device according to the fifth embodiment.
Figure 15:
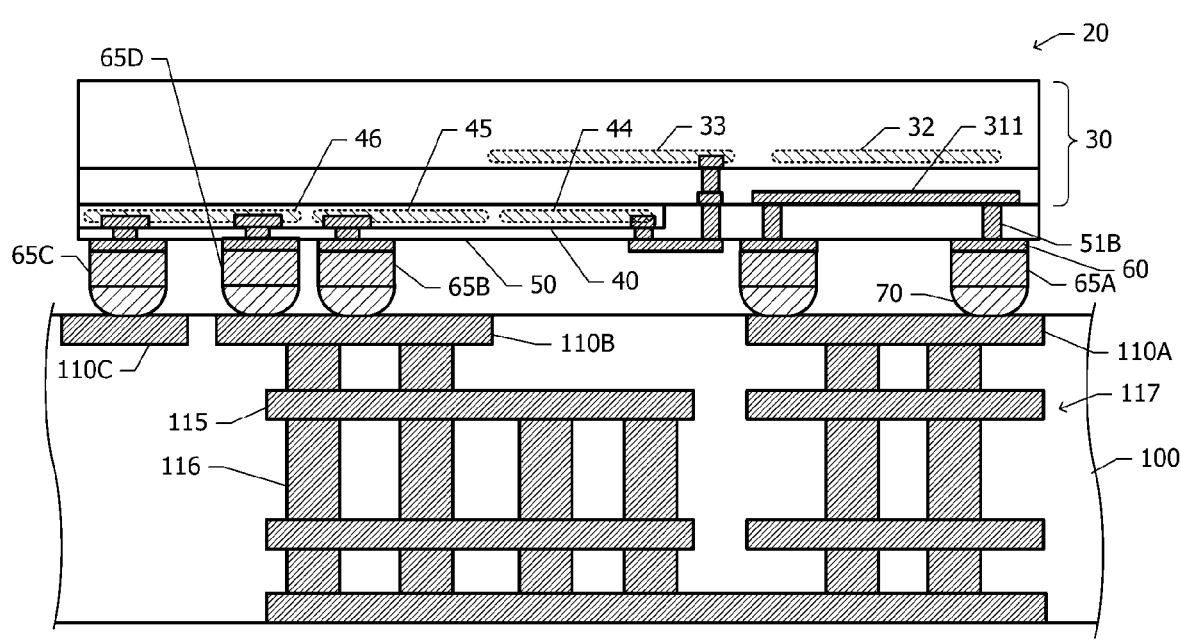
FIG. 15 is a diagram schematically illustrating a sectional structure of a semiconductor module including a module substrate and the semiconductor device according to the fifth embodiment.

Next, referring to FIG. 13, FIG. 14, and FIG. 15, a semiconductor device according to the fifth embodiment is described. In the following description, the descriptions regarding configurations common to the semiconductor device and the semiconductor module according to the first embodiment described with reference to FIG. 1 to FIG. 6D are omitted.

FIG. 13 is a diagram illustrating a planar spatial relationship among constituent elements of a semiconductor device 20 according to the fifth embodiment. In the first embodiment (FIG. 1), the first metal pattern 60 includes the shielded circuit 32 in plan view. Whereas, in the fifth embodiment, in plan view, the first metal patterns 60 are disposed around the shielded circuit 32, and instead of the first metal pattern 60, a second metal pattern 311 includes the shielded circuit 32. The first metal pattern 60 is electrically coupled to the second metal pattern 311 through the opening 63B.

FIG. 14 is a diagram schematically illustrating a sectional structure of the semiconductor device 20 according to the fifth embodiment. The second metal pattern 311 is disposed in the multilayer wiring structure 302 of the first member 30.

The second metal pattern 311 is electrically coupled to the first metal pattern 60 through the via 51B that penetrates through the interlayer insulating film 50 in the thickness direction. The first conductive protrusion 65A protrudes from the first metal pattern 60.

The inter-member connection wire 61 is electrically coupled to the input switch 33 through the via 51A that penetrates through the interlayer insulating film 50 in the thickness direction and a via 312 disposed in the multilayer wiring structure 302.

FIG. 15 is a diagram schematically illustrating a sectional structure of a semiconductor module including the module substrate 100 and the semiconductor device 20 according to the fifth embodiment. The first conductive protrusion 65A is electrically coupled to the ground conductor 117 of the module substrate 100. Because of this, the second metal pattern 311 is electrically coupled to the ground conductor 117 of the module substrate 100 through the via 51B that penetrates through the interlayer insulating film 50 in the thickness direction, the first metal pattern 60, the first conductive protrusion 65A, and the solder 70.

Next, advantageous effects of the fifth embodiment are described. In the fifth embodiment, the second metal pattern 311 serves as the shield structure. The second metal pattern 311 includes the shielded circuit 32 in plan view. Thus, as is the case with the first embodiment, it becomes possible to suppress radio-frequency interference, for example, between the shielded circuit 32 and the second electronic circuit formed in the second member 40, or between the shielded circuit 32 and another electronic circuit provided on the module substrate 100.

Next, a modification of the fifth embodiment is described. In the fifth embodiment, the second metal pattern 311 includes the shielded circuit 32 in plan view. As an alternative configuration, the second metal pattern 311 may be formed in a grid-like pattern or a stripe-like pattern, and a resultant pattern may be disposed so as to overlap the shielded circuit 32 in plan view. The second metal pattern 311 may be disposed on a plurality of wiring layers in the multilayer wiring structure 302.

Sixth Embodiment

Figure 16A:
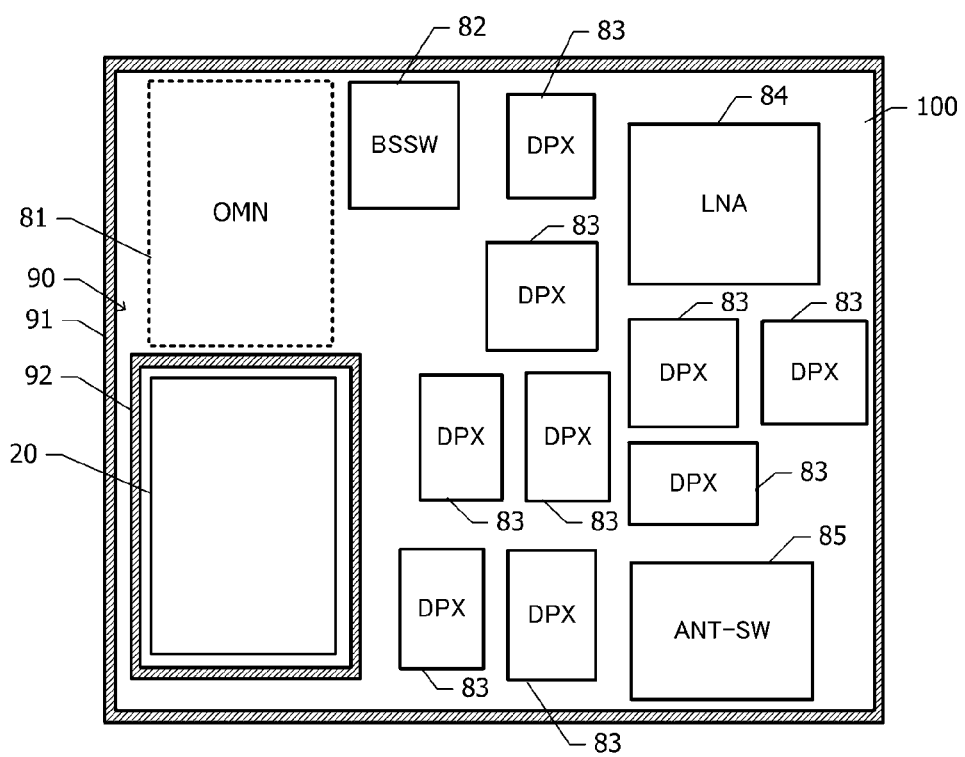
FIG. 16A and FIG. 16B are a diagram illustrating a spatial relationship in plan view among constituent elements of a semiconductor module according to a sixth embodiment and a diagram schematically illustrating a sectional structure thereof, respectively.
Figure 16B:
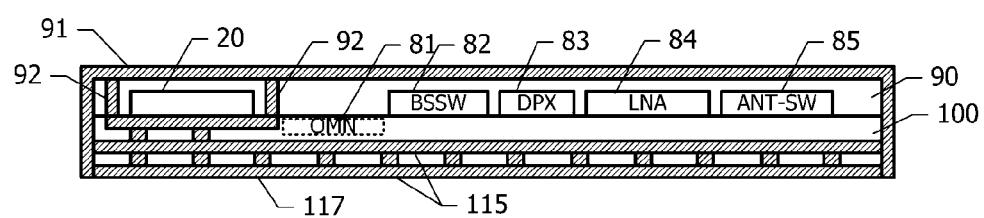
Figure 17:
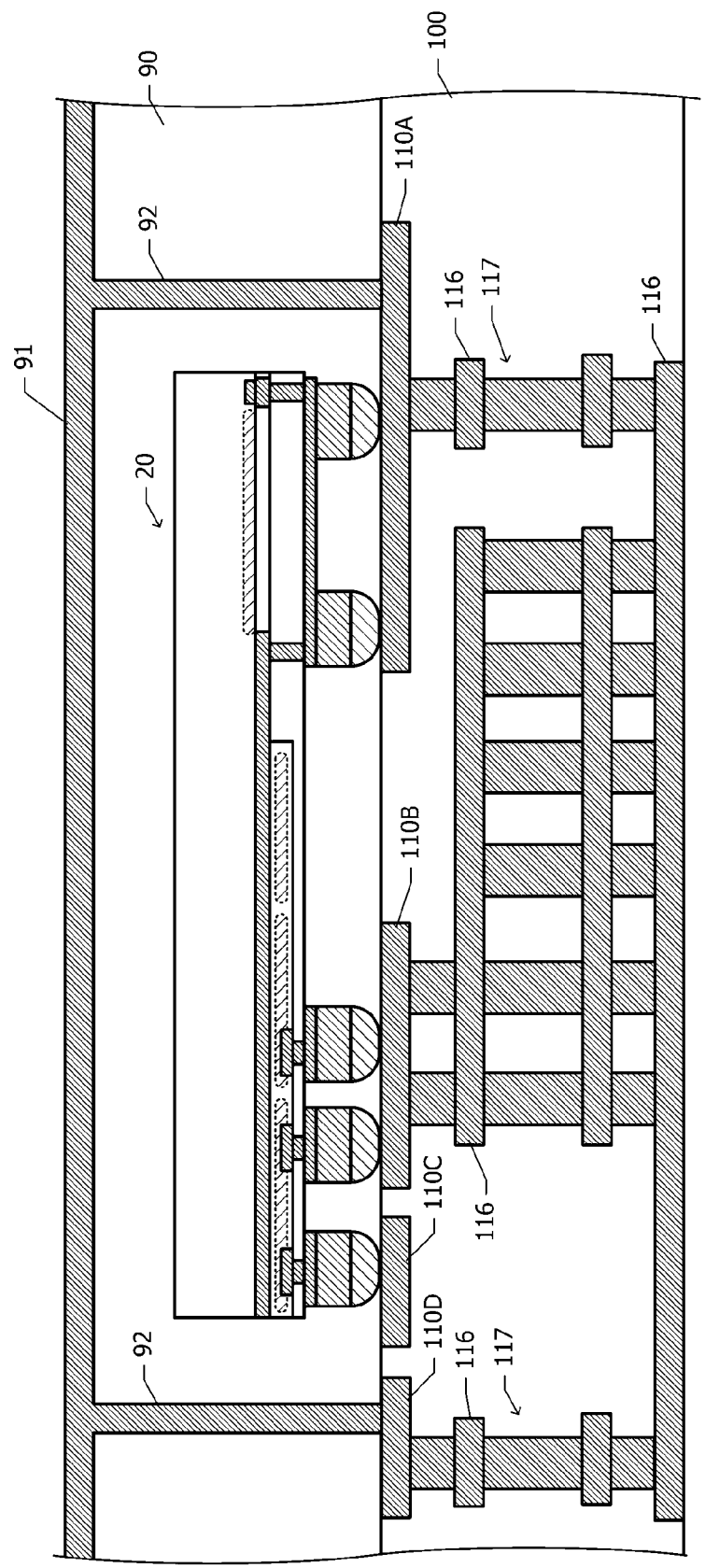
FIG. 17 is a diagram illustrating an enlarged sectional structure of part of the semiconductor module according to the sixth embodiment, on which a semiconductor device is mounted.

Next, referring to FIG. 16A to FIG. 17, a semiconductor module according to the sixth embodiment is described. The semiconductor module according to the sixth embodiment is equipped with the semiconductor device according to the first embodiment (FIG. 1, FIG. 2, and FIG. 3). Instead of the semiconductor device according to the first embodiment, the semiconductor module according to the sixth embodiment may be equipped with the semiconductor device 20 according to one of the second embodiment to the fifth embodiment or the modification thereof.

FIG. 16A and FIG. 16B are a diagram illustrating a spatial relationship in plan view among constituent elements of the semiconductor module according to the sixth embodiment and a diagram schematically illustrating a sectional structure thereof, respectively. The semiconductor device 20, a band selection switch 82, a plurality of duplexers 83, a low-noise amplifier 84, and an antenna switch 85 are mounted on the module substrate 100. Moreover, an output matching circuit 81 formed from, for example, wiring patterns is provided on the module substrate 100. The output matching circuit 81 may be formed from an integrated passive device (IPD) or a plurality of surface mount components.

A plurality of electronic components mounted on the module substrate 100 are sealed by a resin member 90. The resin member 90 covers the mount surface of the module substrate 100, the semiconductor device 20, and other mount components. The resin member 90 has a top surface facing in the same direction as the mount surface of the module substrate 100 and side surfaces that continue from the top surface. A metal shield film 91 is formed on the top surface and the side surfaces of the resin member 90 and the side surfaces of the module substrate 100. End faces of a plurality of the ground planes 115 provided in the module substrate 100 are exposed on the side surfaces of the module substrate 100. The metal shield film 91 is coupled to the ground planes 115 at the side surfaces of the module substrate 100. The metal shield film 91 is formed, for example, by sputtering.

A shield wall 92 is provided in the resin member 90 so as to surround the semiconductor device 20 in plan view. The shield wall 92 reaches from the top surface of the resin member 90 to the mount surface of the module substrate 100 and is electrically coupled to the metal shield film 91 and the ground conductor 117 of the module substrate 100.

Next, functions of the respective electronic components mounted on the module substrate 100 are described. A radio-frequency signal output from the power-stage amplifier circuit 46 (FIG. 1) of the semiconductor device 20 is input to the band selection switch 82. The band selection switch 82 selects one of the plurality of duplexers 83 based on the band, to which the input radio-frequency signal belongs, and transmits the radio-frequency signal to the selected duplexer 83. The radio-frequency signal passed through the duplexer 83 is output to an external antenna via the antenna switch 85.

A received signal received by an antenna is input to one of the duplexers 83 via the antenna switch 85. The received signal passed through the duplexer 83 is amplified by the low-noise amplifier 84 and output to the outside.

FIG. 17 is a diagram illustrating an enlarged sectional structure of part of the semiconductor module according to the sixth embodiment, on which the semiconductor device 20 is mounted. In addition to the first land 110A, the second land 110B, and the third land 110C, a fourth land 110D is disposed on the mount surface of the module substrate 100. The fourth land 110D is coupled to the ground conductor 117 of the module substrate 100. The shield wall 92 is coupled to the first land 110A and the fourth land 110D.

Next, advantageous effects of the sixth embodiment are described. The metal shield film 91 and the shield wall 92 serve as the shield structure in terms of radio frequencies. This enables radio-frequency interference to be suppressed between the semiconductor device 20 and the outside and radio-frequency interference to be suppressed between the semiconductor device 20 and another electronic component mounted on the module substrate 100 or between the semiconductor device 20 and the output matching circuit 81 formed on the module substrate 100.

Figure 18:
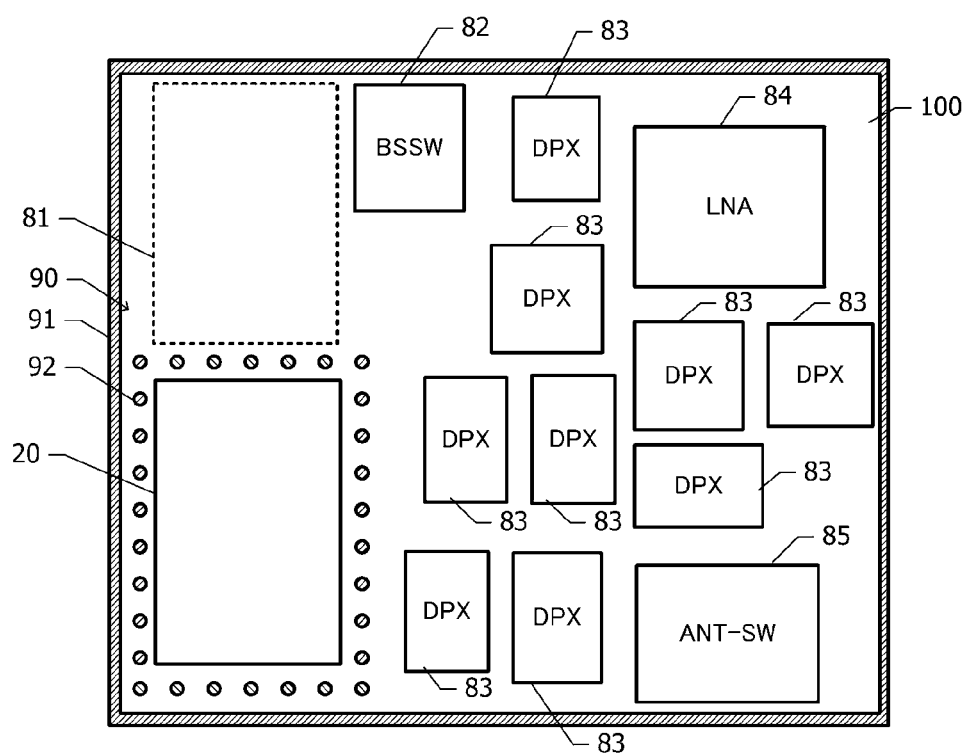
FIG. 18 is a diagram illustrating a spatial relationship in plan view among constituent elements of a semiconductor module according to a modification of the sixth embodiment.

Next, referring to FIG. 18, a modification of the sixth embodiment is described. FIG. 18 is a diagram illustrating a spatial relationship in plan view among constituent elements of a semiconductor module according to the modification of the sixth embodiment. In the sixth embodiment (FIG. 16A), the shield wall 92 continuously surrounds the semiconductor device 20. However, in the present modification, the shield wall 92 surrounds the semiconductor device 20 discontinuously. For example, the shield wall 92 is formed of a plurality of pillar-like conductive members, for example, conductor pins, that penetrate through the resin member 90 in the thickness direction. The plurality of conductive members are disposed so as to surround the semiconductor device 20 with gaps therebetween in plan view.

As described above, it becomes possible to have an effect of suppressing radio-frequency interference even using the shield wall 92 configured to surround the semiconductor device 20 discontinuously.

Next, another modification of the sixth embodiment is described. In the sixth embodiment, the shield wall 92 (FIG. 16A) surrounds the semiconductor device 20 in four directions. However, the shield wall 92 may be configured so as to surround the semiconductor device 20 in three directions or two directions. For example, the shield wall 92 may be disposed so as to separate the semiconductor device 20 from another electronic component or another electronic circuit mounted on the module substrate 100.

In the sixth embodiment, as the module substrate 100, a single-sided mount substrate is used. However, as the module substrate 100, a double-sided mount substrate may alternatively be used. At least one of the plurality of duplexers 83 may be replaced with a filter for transmitting signals and a filter for received signals.

Needless to say, each of the foregoing embodiments is for illustrative purposes only, and constituent elements illustrated in different embodiments may be partially exchanged or combined. Similar functions and effects produced by similar constituent elements of different embodiments are not repeated in every embodiment. Moreover, the present disclosure is not limited to the foregoing embodiments. For example, it would be obvious to a person skilled in the art that various changes, improvements, and combinations can be made.

What is claimed is:

1. A semiconductor device comprising:
   a first member in which a first electronic circuit including a semiconductor element is configured;
   a second member in which a second electronic circuit is configured, the second electronic circuit including a semiconductor element configured of a semiconductor material that is different from a semiconductor material of the semiconductor element of the first electronic circuit, the second electronic circuit being joined to an area of part of a first surface, the first surface being one of surfaces of the first member;
   an interlayer insulating film that covers the second member and an area of the first surface to which the second member is not joined;
   an inter-member connection wire disposed on the interlayer insulating film, the inter-member connection wire coupling the first electronic circuit and the second electronic circuit through an opening in the interlayer insulating film; and
   a shield structure that includes a first metal pattern disposed on the interlayer insulating film and shields a shielded circuit in terms of radio frequencies, the shielded circuit being part of the first electronic circuit.

2. The semiconductor device according to claim 1, further comprising:
   a first conductive protrusion protruding from the first metal pattern.

3. The semiconductor device according to claim 1, wherein
   the shield structure further includes a plurality of vias disposed between an area where the shielded circuit is disposed and an area where the second electronic circuit is disposed in plan view, and
   the plurality of vias penetrate the interlayer insulating film in a thickness direction and are coupled to the first metal pattern.

4. The semiconductor device according to claim 1, wherein
   the first metal pattern is disposed so as to overlap the shielded circuit in plan view.

5. The semiconductor device according to claim 1, wherein
   the first metal pattern is a metal film including the shielded circuit in plan view.

6. The semiconductor device according to claim 1, wherein
   the shield structure further includes a plurality of metal wires disposed so as to pass through an area where the shielded circuit is disposed in plan view, and
   the plurality of metal wires are fixed to the first metal pattern.

7. The semiconductor device according to claim 1, wherein
   the first member further includes a metal area at an interface with the second member, and
   the metal area is electrically coupled to the first metal pattern.

8. The semiconductor device according to claim 1, wherein
   the first member includes a multilayer wiring structure disposed on the first electronic circuit,
   the multilayer wiring structure includes a second metal pattern that overlaps an area where the shielded circuit is disposed in plan view,
   the interlayer insulating film is disposed on the multilayer wiring structure, and the first metal pattern is coupled to the second metal pattern through an opening in the interlayer insulating film.

9. The semiconductor device according to claim 2, wherein
the shield structure further includes a plurality of vias disposed between an area where the shielded circuit is disposed and an area where the second electronic circuit is disposed in plan view, and
the plurality of vias penetrate the interlayer insulating film in a thickness direction and are coupled to the first metal pattern.

10. The semiconductor device according to claim 2, wherein
the first metal pattern is disposed so as to overlap the shielded circuit in plan view.

11. The semiconductor device according to claim 3, wherein
the first metal pattern is disposed so as to overlap the shielded circuit in plan view.

12. The semiconductor device according to claim 2, wherein
the first metal pattern is a metal film including the shielded circuit in plan view.

13. The semiconductor device according to claim 3, wherein
the first metal pattern is a metal film including the shielded circuit in plan view.

14. The semiconductor device according to claim 2, wherein
the shield structure further includes a plurality of metal wires disposed so as to pass through an area where the shielded circuit is disposed in plan view, and
the plurality of metal wires are fixed to the first metal pattern.

15. The semiconductor device according to claim 2, wherein
the first member further includes a metal area at an interface with the second member, and
the metal area is electrically coupled to the first metal pattern.

16. The semiconductor device according to claim 2, wherein
the first member includes a multilayer wiring structure disposed on the first electronic circuit,
the multilayer wiring structure includes a second metal pattern that overlaps an area where the shielded circuit is disposed in plan view,
the interlayer insulating film is disposed on the multilayer wiring structure, and
the first metal pattern is coupled to the second metal pattern through an opening in the interlayer insulating film.

17. A semiconductor module comprising:
a module substrate; and
a semiconductor device mounted on a mount surface of the module substrate, wherein
the semiconductor device includes
a first member in which a first electronic circuit including a semiconductor element is configured,
a second member in which a second electronic circuit is configured, the second electronic circuit including a semiconductor element configured of a semiconductor material that is different from a semiconductor material of the semiconductor element of the first electronic circuit, the second electronic circuit being joined to an area of part of a first surface, the first surface being one of surfaces of the first member,
an interlayer insulating film that covers the first surface and the second member,
an inter-member connection wire disposed on the interlayer insulating film, the inter-member connection wire coupling the first electronic circuit and the second electronic circuit through an opening in the interlayer insulating film,
a shield structure that includes a first metal pattern disposed on the interlayer insulating film and shields a shielded circuit in terms of radio frequencies, the shielded circuit being part of the first electronic circuit,
a first conductive protrusion protruding from the first metal pattern, and
a second conductive protrusion provided on a surface of the second member that faces the module substrate, the second conductive protrusion being coupled to ground of the second electronic circuit,
the module substrate includes
a ground conductor, and
a first land and a second land coupled to the ground conductor, and
the first land and the second land are coupled to the first conductive protrusion and the second conductive protrusion, respectively.

18. The semiconductor module according to claim 17, wherein
the ground conductor includes
a plurality of layers of ground planes disposed on an inner layer of the module substrate and a lower surface opposite to the mount surface of the module substrate, and
a plurality of ground vias that couple the plurality of layers of ground planes in a thickness direction of the module substrate,
at a location shallower than a first location from the mount surface in the thickness direction of the module substrate, a ground plane coupled to the first land and a ground plane coupled to the second land are separated from each other, and at a location deeper than the first location, a ground plane coupled to the first land is continuous to a ground plane coupled to the second land.

19. The semiconductor module according to claim 17, further comprising:
a resin member that covers the mount surface of the module substrate and the semiconductor device;
a metal shield film disposed on a surface of the resin member that faces a same direction as the mount surface; and
a shield wall electrically coupled to the metal shield film and the ground conductor, the shield wall penetrating through the resin member in a thickness direction and surrounding the semiconductor device continuously or discontinuously in plan view.

20. The semiconductor module according to claim 18, further comprising:
a resin member that covers the mount surface of the module substrate and the semiconductor device;
a metal shield film disposed on a surface of the resin member that faces a same direction as the mount surface; and a shield wall electrically coupled to the metal shield film and the ground conductor, the shield wall penetrating through the resin member in a thickness direction and surrounding the semiconductor device continuously or discontinuously in plan view.

* * * * *